United States Patent [19]

Anderson

[11] Patent Number: 4,551,705

[45] Date of Patent: Nov. 5, 1985

[54] PROGRAMMABLE INTEGRATED CIRCUIT AC RESISTOR NETWORK

[75] Inventor: Robert D. Andersen, West Covina, Calif.

[73] Assignee: Honeywell Inc., Minneapolis, Minn.

[21] Appl. No.: 460,100

[22] Filed: Jan. 21, 1983

Related U.S. Application Data

[63] Continuation-in-part of Ser. No. 278,926, Jun. 30, 1981, abandoned.

[51] Int. Cl.$^4$ ............................................. H03K 13/02
[52] U.S. Cl. ............................. 340/347 DA; 357/23.1
[58] Field of Search ................................. 340/347 DA; 357/23.1–23.15; 307/571

[56] References Cited

U.S. PATENT DOCUMENTS

| | | | |
|---|---|---|---|
| 3,646,587 | 2/1972 | Shaffstall et al. | 340/347 DA |
| 3,995,304 | 11/1976 | Pease | 357/36 |
| 4,045,793 | 8/1977 | Moench | 340/347 DA |
| 4,152,714 | 5/1979 | Hendrickson | 357/23 |
| 4,311,988 | 1/1982 | Kelley et al. | 340/347 DA |

Primary Examiner—Charles D. Miller
Attorney, Agent, or Firm—Charles L. Rubow

[57] ABSTRACT

A monolithic integrated circuit D-to-A converter and programmable AC resistor network and current source is disclosed in which an array of FET cells formed on a semiconductor body is divided into a plurality of distinct sets which may be grouped in two groups of corresponding sets. The source and drain regions respectively of all of the cells in each group are connected in common. The gate regions of the cells in each distinct set are also connected. In embodiments comprising two groups of cells, gate control logic is included which may supply signals of opposite binary states respectively to the gate regions of corresponding sets of cells in the two groups.

7 Claims, 6 Drawing Figures

PROGRAMMABLE INTEGRATED CIRCUIT AC RESISTOR NETWORK

CROSS-REFERENCE TO RELATED APPLICATION

This is a continuation-in-part of application Ser. No. 278,926, filed June 30, 1981 now abandoned.

BACKGROUND OF THE INVENTION

The invention disclosed herein relates generally to monolithic integrated circuits in which an analog output parameter is controlled by a digital signal, and more particularly to digital-to-analog converter and programmable AC resistor and current source designs implemented with field effect transistors in monolithic integrated circuits.

A variety of circuits for achieving an analog output corresponding to a digital input, broadly referred to as digital-to-analog (D-to-A) converters, have been and continue to be required for a wide range of purposes. The trend is toward use of such circuits in increasingly large numbers. Concurrently, there are demands to increase performance, improve reliability and decrease size, power consumption and production costs. Integrated circuit technology has made and continues to make substantial strides toward these general objectives. An increasing number of circuit designs are being reduced to integrated circuit form.

Circuits which have been reduced to integrated circuit form include a variety of D-to-A converters. An example of one such converter is found in U.S. Pat. No. 3,978,473 issued to J. Pastoriza on Aug. 31, 1976. This converter utilizes an integrated circuit switch module including four switch transistors and associated switch control buffering circuitry. The emitter areas of the switch transistors are binarily weighted to provide equal current densities. A fifth reference transistor is provided for adjusting the supply voltage as necessary to maintain constant current through the switch transistors. A number of such switch modules may be combined to construct a D-to-A converter having high bit resolution.

Notwithstanding the foregoing example, prior D-to-A converter designs have generally not optimally adapted integrated circuit technology to the special requirements of D-to-A converters, and have not fully realized the potential of the technology. Many of the designs, such as the one disclosed in the aforementioned patent, utilize bi-polar transistors. Such transistors inherently have offset voltages which must be dealt with, and are essentially unidirectional current devices. Thus, AC conversion with such designs necessitates the use of complex circuitry, and at best, leaves features to be desired.

Various characteristics of bi-polar transistors which are disadvantageous in certain applications are not present in field effect transistors (FETs. Specifically FETs do not inherently operate with an offset voltage, and they are inherently bi-directional. However, at least until recently, field effect transistors have had certain disadvantageous characteristics which made them unsuitable for some applications. Such characteristics included a relatively high "on" resistance, thus limiting the current with which they were useable, a relatively low breakdown voltage, and significant variations in operating parameters of individual FETs. The latter factor affects the accuracy of FET implemented D-to-A converters.

Nevertheless, as shown in U.S. Pat. No. 4,045,793 issued to J. Moench on Aug. 30, 1977, FETs have been advantageously used in integrated circuit D-to-A converter designs. In accordance with this patent various number combinations or groups of field effect transistor switches are coupled between a voltage supply conductor and an analog current output conductor. Each group of field effect transistors is controlled through an input buffer circuit and a control or switching circuit by a separate digital input. Each switching circuit comprises a first field effect transistor connecting the gates of the field effect transistors in a group to one terminal of a current source through the source-drain terminals of the first field effect transistor. The switching circuit also comprises a second field effect transistor connecting the gates of the field effect transistors in a group to a voltage source through the source-drain terminals of the second field effect transistor. The gates of the first and second field effect transistors are respectively controlled from outputs of a series connected pair of inverters. According to the patent, the switching circuitry provides for an analog output which is independent of variations in levels of the digital input signals, and assures that each FET operates in the saturation portion of its current-voltage characteristic to achieve improved accuracy required in many applications.

As disclosed in U.S. Pat. Nos. 3,783,349 issued to J. Beasom on Jan. 1, 1974 and 4,148,046, 4,148,047 and 4,152,714 issued to T. Hendrickson alone or with others on April 3 and May 1, 1979, improved designs have recently been devised for integrated circuit FETs. These designs effectively provide for lower "on" resistance, higher voltage operation, faster response and higher production yields. The improvements are achieved by employing large number of small specially configured and densely arranged cells formed on a semiconductor body.

The applicant has devised a monolithic integrated circuit FET D-to-A converter design which takes advantage of recent improvements in FETs to provide a particularly simple converter and programmable AC resistor network and current source. For present purposes a monolithic integrated circuit is defined as an integrated circuit whose elements are formed in situ upon or within a semiconductor substrate. A large number of ideally identical individual FET cells are utilized. The "on" resistance of the FETs is quite uniform. Sets of the cells operate in parallel, thus averaging out and further reducing any deviations from the predetermined resistance. If resistance value trimming is desired, it can be accomplished with a simple interconnect trim. True AC resistance is provided, with no DC effect. Finally, the device geometry and required production processes are compatible with and facilitate integration with other circuitry, thus permitting fabrication of digital and analog devices on a common substrate.

SUMMARY OF THE INVENTION

The present invention is an integrated circuit FET D-to-A converter and programmable AC resistor network and current source. It comprises a monolithic substrate having a plurality of ideally identical FET cells formed thereon and interconnected in distinct sets. The gate region of the cells in each set are connected in common. The sets may be separated into two corresponding groups. The source and drain regions of all the cells in at least each group are connected to common source and drain terminals respectively. Embodiments having two groups of FET cells include gate control circuitry which supplies corresponding sets of cells in the groups with mutually inverted binary gate signals. The numbers of cells in the sets in each of the groups may be binarily weighted. A constant voltage source may also be formed on the substrate and connected to the source or drain regions of the FET cells so as to provide a programmable current source.

DESCRIPTION OF THE PREFERRED EMBODIMENTS

Figure 1:
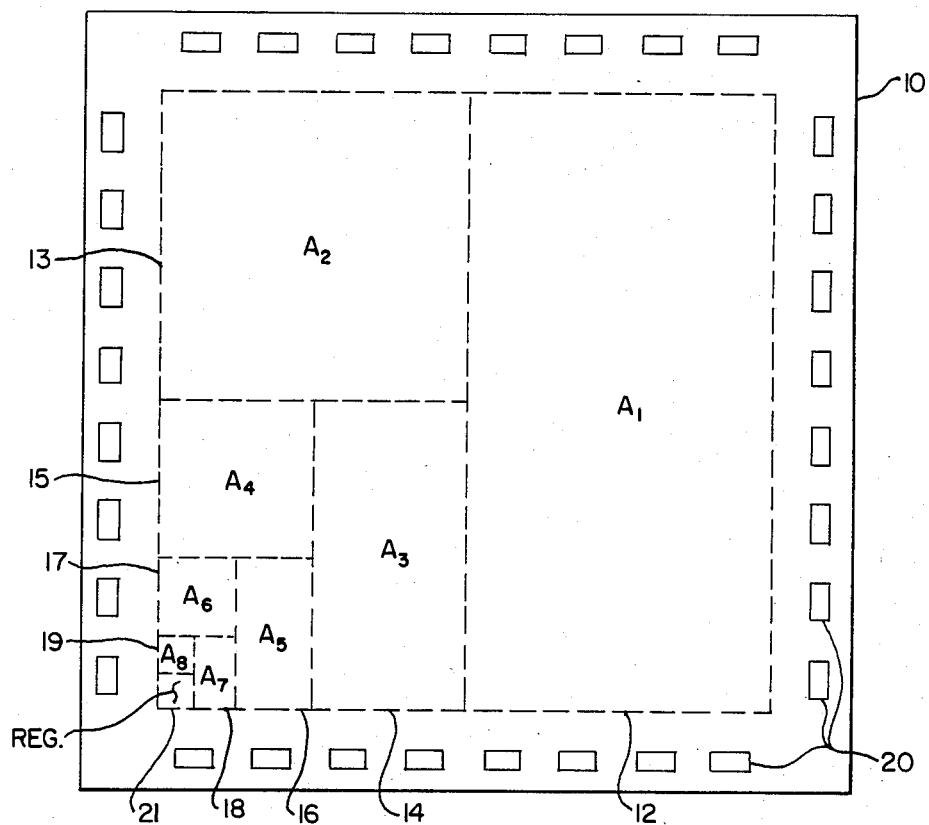
FIG. 1 is a plan view of a die or monolithic semiconductor body subdivided into distinct areas for containing sets of FET cells connected in accordance with the applicant's invention.

A D-to-A converter or programmable AC resistor or current source in accordance with the applicant's invention basically comprises a large number of ideally identical FET cells formed on a common monolithic body or substrate and interconnected in certain distinct sets. In FIG. 1, the substrate is identified by reference numeral 10. In accordance with conventional integrated circuit processing methods, substrate 10 is a die cut from a single crystal wafer of semiconductor material, such as silicon. An array of FET cells is formed on a major surface 11 (see FIGS. 3 and 4) of substrate 10 using conventional processes for forming such transistors. The major surface of the substrate is subdivided into areas $A_1$–$A_8$ identified by reference numerals 12–19 respectively, each containing a distinct set of cells. All of the cells are ideally identical. As will hereinafter be described in greater detail, the source and drain regions of all the cells are respectively connected together by either metalized or doped interconnecting conductors on the substrate. The conductor interconnecting the source regions is connected to one of a plurality of electrical lead connection pads or terminals 20 on the substrate. Similarly, the conductor interconnecting the drain regions is connected to another one of pads 20.

The gate regions of all of the cells of the set in a particular area are connected together. The gate conductor for each area is connected to an additional one of pads 20, so that there is a separate gate pad for each area. The cells are arranged with uniform density throughout the areas. As shown in FIG. 1, the sizes of the areas are binarily weighted, thus indicating that the number of cells in an area is related to the number of cells in any other area by a factor of two. Also shown in FIG. 1 is an area 21 dedicated to an on-board voltage regulator for producing a constant voltage which may be applied to the FET cells (resistors) on the remainder of substrate 10 to produce a programmable current source. Although not illustrated in FIG. 1, substrate 10 may also carry other integrated circuit digital and/or analog circuitry as necessary for any particular application. Power for regulator 21 and any other on-board circuitry, and control signals necessary for such circuitry may be brought in through other pads 20.

Figure 2:
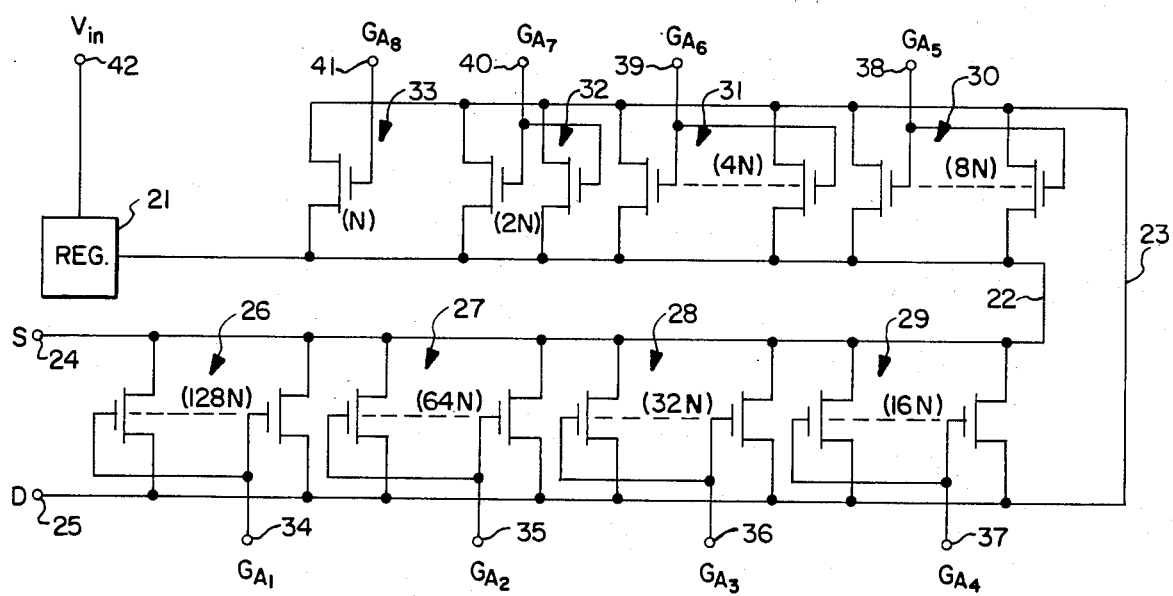
FIG. 2 is a schematic circuit diagram of a programmable AC resistor and current source in accordance with the applicant's invention.

The array of FET cells described in connection with FIG. 1 is schematically shown in FIG. 2. The electrical conductors connecting the source and drain regions respectively of all of the cells are identified by reference numerals 22 and 23. Source conductor 22 is connected to a source terminal 24 corresponding to one of pads 20 in FIG. 1. Drain conductor 23 is connected to a drain terminal 25 corresponding to another of pads 20. The sets of cells lying in areas 12–19 are schematically represented in FIG. 2 where they are identified by reference numerals 26–33 respectively.

It is pointed out that the FET symbols shown in FIG. 2 each represent a large number of cells. Thus, even the area with the fewest cells contains a sufficient number of cells so that operational variations between individual cells are averaged out. Hereinafter for purposes of simplifying the description, the smallest set of cells may be referred to as a single FET. As illustrated, area 12 contains 128 times as many cells as area 19, the smallest area shown. The gate regions of the cells in area 12 are interconnected and connected to a gate terminal 34. Area 13 schematically contains 64 FETs whose gates are interconnected and connected to a gate terminal 35. Similarly, areas 14–19 contain 32, 16, 8, 4, 2 and 1 FET respectively. The FETs in areas 14–19 have gates connected to terminals 36–41 respectively.

In the illustrated embodiment, the areas and numbers of cells therein are binarily weighted. However, such weighting is not necessary. The most appropriate weighting scheme is determined by the requirements of the intended application. The resistances provided by the cells in the individual areas vary inversely with the number of paralleled cells in the areas. Thus, area 19 which schematically contains only single FET 33 is associated with the greatest resistance and may be associated with the most significant bit. Similarly, area 12 which schematically contains 128 FETs may be associated with the least significant bit.

As shown in FIG. 2, voltage regulator 21 is connected to source conductor 22. Regulator 21 is supplied with electrical power through a terminal 42 corresponding to one of pads 20 in FIG. 1. With the addition of voltage regulator 21, the circuitry illustrated in FIG. 2 becomes a programmable current source.

Figure 3:
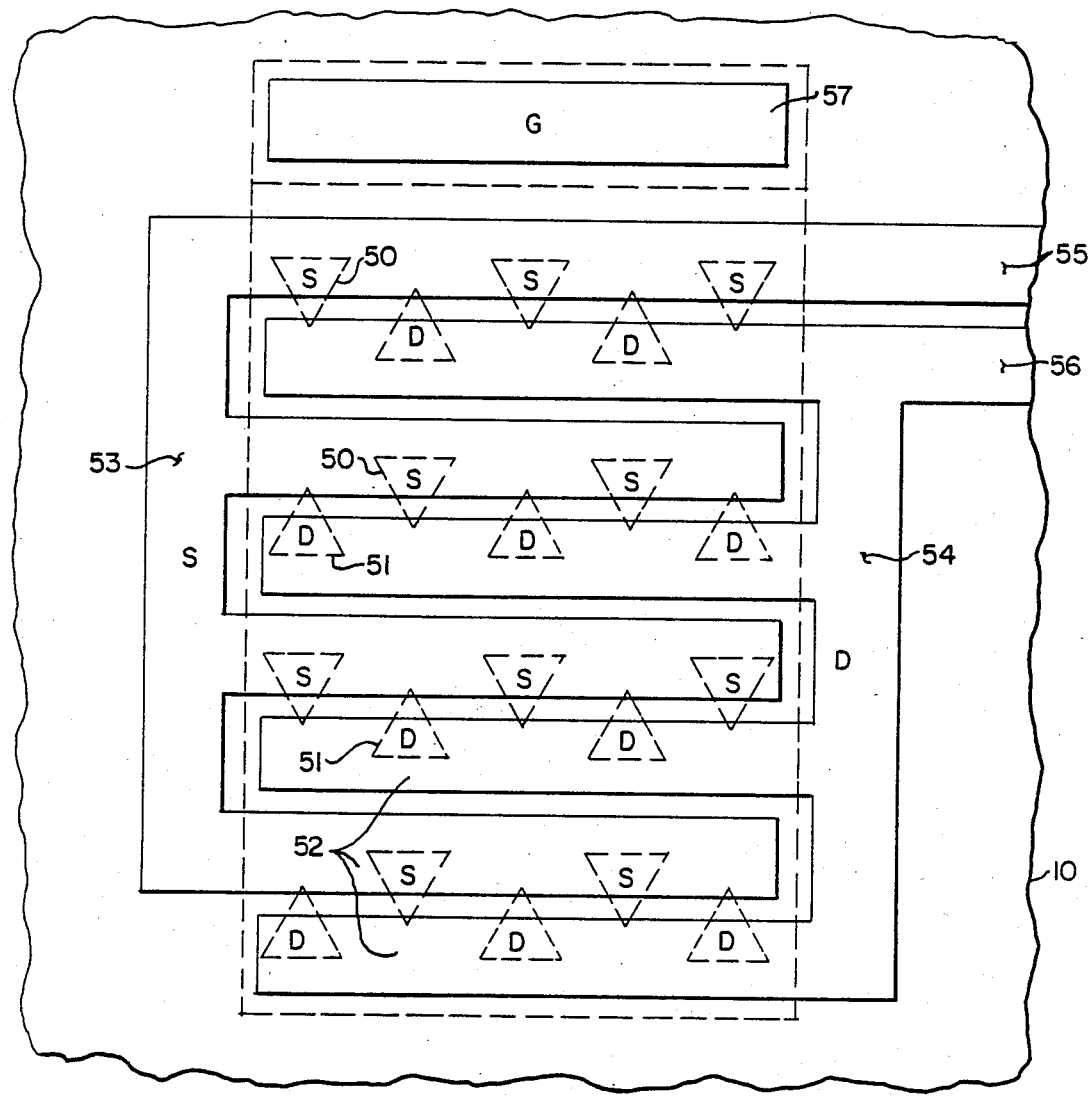
FIG. 3 is a preferred geometrical layout of the FET cells in an area on the die shown in FIG. 1.
Figure 4:
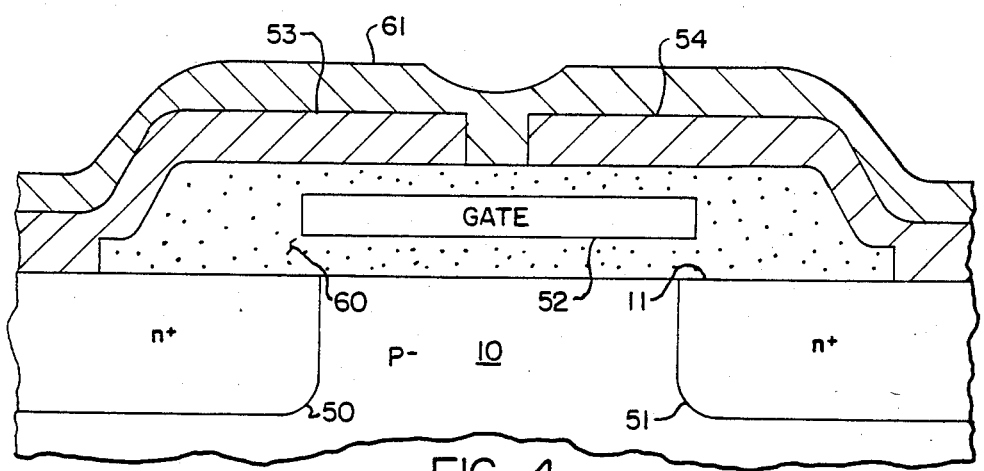
FIG. 4 is a representative cross-sectional view of a cell shown in FIG. 3.

FIGS. 3 and 4 illustrate monolithic integrated circuit FET geometry found particularly suitable for the applicant's D-to-A converter. This geometry is described in detail in previously identified Pat. Nos. 4,148,046, 4,148,047 and 4,152,714. For purposes of the present brief description, source and drain regions are identified by reference numerals 50 and 51 respectively, and are in the form of equilateral triangles. The matrix between the triangles, identified by reference numeral 52, comprises gate regions or electrodes. The source and drain regions are in electrical contact with source and drain electrical conductors 53 and 54 respectively. The source and drain conductors may be in metalized form, or may be appropriately doped regions in substrate 10. The source and drain conductors are continued as shown at 55 and 56 respectively to connect with the source and drain conductors of FET arrays in other areas, and ultimately to connect to appropriate pads 20 at the periphery of substrate 10. Similarly, a gate conductor 57 is in electrical contact with gate regions 52, and connects them to an appropriate pad 20 for the gates for a particular area. Source regions 50 and drain regions 51 are in the form of equilateral triangles so as to maximize the density of FET cells on major surface 11 of substrate 10 for reasons which are explained in detail in the noted patents.

As shown in the cross section of FIG. 4, substrate 10 is doped to P-type conductivity. Source and drain regions comprise N-type conductivity areas. An insulating layer 60 is formed on major surface 11 and surrounds gate region 52. Source conductor 53 is in electrical contact with source regions 50 and, as shown, extends partially across insulating layer 60. Similarly, drain conductor 54 is in electrical contact with drain regions 51, and also extends partially across insulating layer 60. A passivating layer 61 is formed across the top surface of the fabricated FET array.

Figure 5:
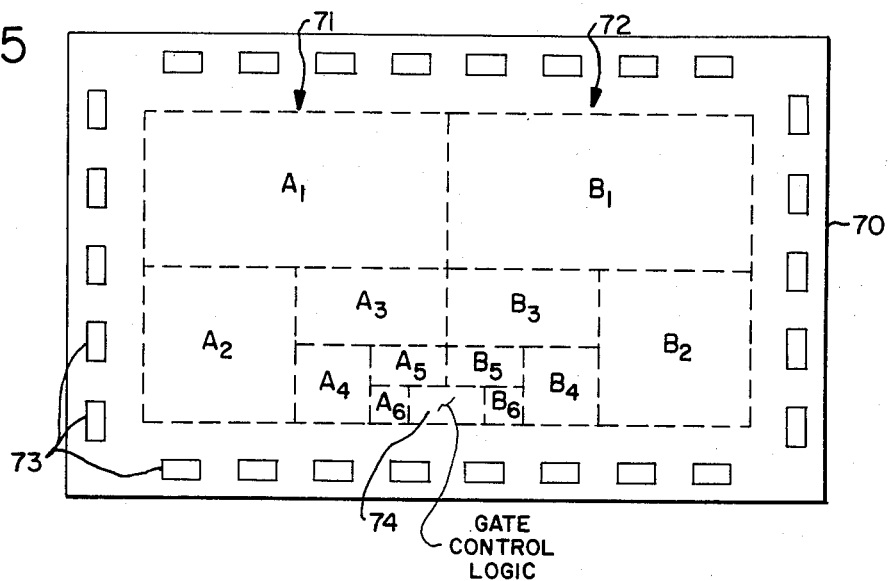
FIG. 5 is a plan view of a monolithic semiconductor body containing two groups of corresponding sets of FET cells for forming a variable voltage divider in accordance with the applicant's invention.

FIG. 5 illustrates the plan of a semiconductor die for forming a digitally programmable variable voltage divider. The die, which is identified by reference numeral 70, is similar to die 10 of FIG. 1 in that an array of FET cells is formed on a major surface thereof. The major surface is subdivided into areas $A_1$–$A_6$ and $B_1$–$B_6$. Areas $A_1$–$A_6$ and $B_1$–$B_6$ each comprise subdivisions similar to subdivisions $A_1$–$A_8$ FIG. 1. Areas $A_1$–$A_6$ and $B_1$–$B_6$ each contain a separate set of FET cells. The cells in areas $A_1$–$A_6$ comprise a first group of cells 71. Similarly, the cells in areas $B_1$–$B_6$ comprise a second group of cells 72. As described in connection with the embodiment of FIG. 1, the source regions and the drain regions of all of the cells in group 71 are respectively connected together by either metalized or doped interconnecting conductors on the substrate. The conductor interconnecting the source regions of the cells in group 71 is connected to one of a plurality of electrical lead connection pads or terminals 73 on the substrate. The conductor interconnecting drain regions of the cells in group 71 is connected to another of terminals 73. Similarly, the source regions and the drain regions of all of the cells in group 72 ar respectively connected together and connected to others of terminals 73. The gate regions of all of the cells of each set are connected together and to gate control logic circuitry 74 which will be further described in connection with FIG. 6.

Figure 6:
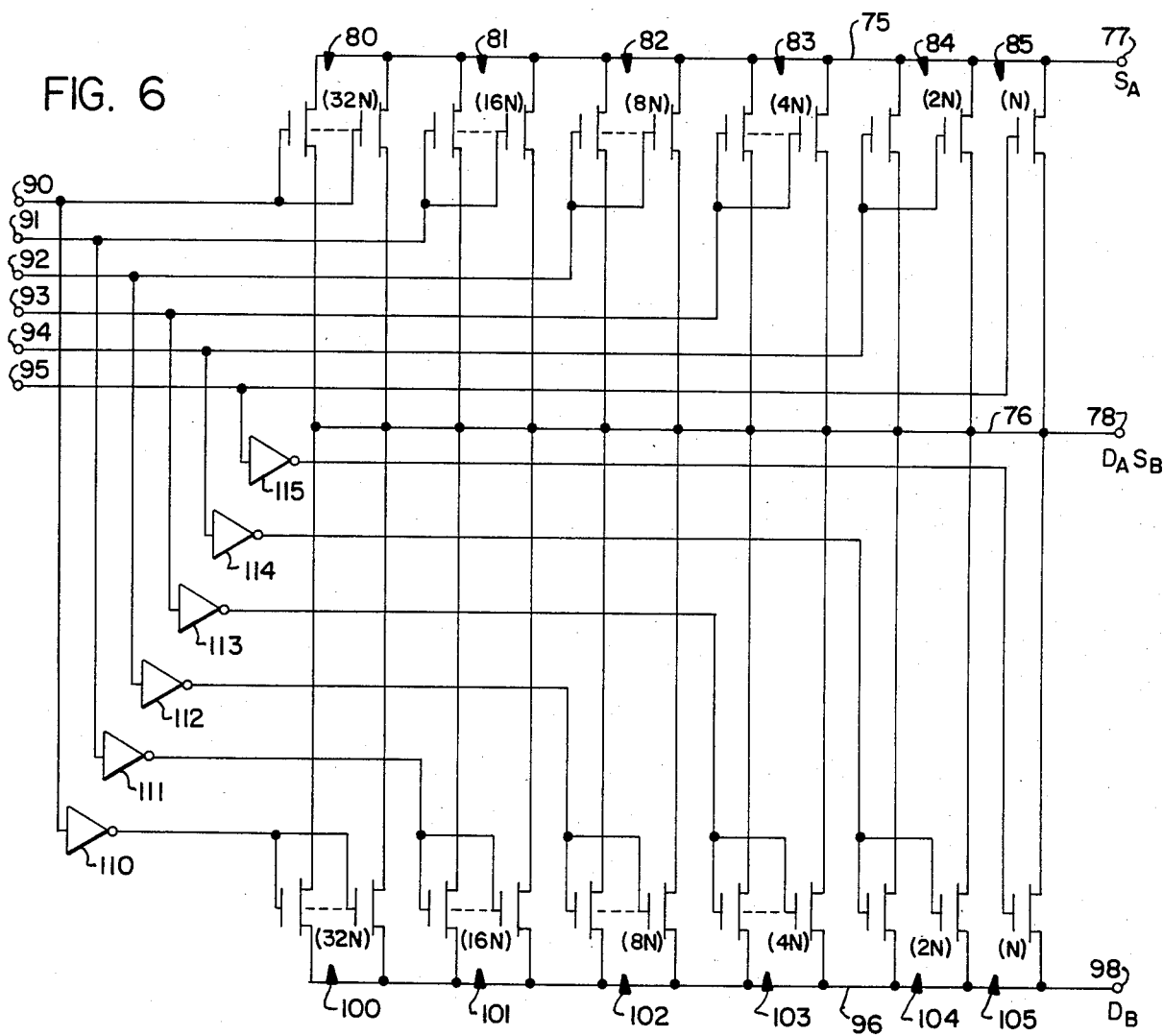
FIG. 6 is a schematic circuit diagram of a variable voltage divider in accordance with the applicant's invention.

The array of FET cells described in connection with FIG. 5 is schematically shown in FIG. 6. The electrical conductors connecting the source and drain regions respectively of all of the cells in group 71 are identified by reference numbers 75 and 76. Source conductor 75 is connected to a first output terminal 77 corresponding to one of pads 73 in FIG. 5. Conductor 76 is connected to a second output terminal 78 corresponding to another of pads 73. The sets of cells lying in areas $A_1$–$A_6$ of FIG. 5 are identified by reference numerals 80–85 in FIG. 6. As illustrated, set 85 contains N FET cells and sets 84–80 respectively contain 2N, 4N, 16N and 32N cells. The gates of the cells in sets 80–85 are connected by means of electrical conductors directly to control terminals 90–95 respectively.

The source regions of the cells in group 72 are connected by conductor 76 to second output terminal 78. The drain regions of these cells are connected by a conductor 96 to a third output terminal 98. The sets of cells in areas $B_1$–$B_6$ of FIG. 5 are identified by reference numerals 100–105 in FIG. 6. As illustrated, set 105 contains N cells corresponding to the number of cells in set 85. Similarly, sets 104–100 contain 2N, 4N, 8N, 16N and 32N cells corresponding to the numbers of cells in sets 84–80.

The gate regions of the cells in sets 100–105 are connected to control terminals 90–95 respectively through inverters 110–115. The conductors connecting control terminals 90–95 to sets 80–85 and inverters 100–105 and associated conductors form gate control logic 74. Terminals 90–95 are each adapted to receive a binary signal having a first or second state. A signal of one state at one of control terminals 90–95 causes the cells associated with that control terminal in one of groups 71 and 72 to assume a low resistance state, and the cells in the corresponding set in the other group to assume a high resistance state. Thus, the corresponding sets of cells in the two groups are controlled in a complimentary manner so as to achieve a potentiometer or variable voltage divider function.

The illustrated embodiments of the applicant's invention are shown employing isolated gate FETs (IGFETs). However, the invention can also be satisfactorily implemented with junction FETs (JFETs). A variable voltage divider network is specifically disclosed as an example of a programmable resistor network having more than two terminals. Other network configurations and variations and modifications of the disclosed designs will be apparent to those familiar with the relevant arts. It is intended that coverage of the invention not be limited to the embodiments shown, but only by the terms of the following claims.

I claim:

1. A digitally programmable AC resistor network comprising:
a monolithic body of semiconductor material having a plurality of ideally identical field effect transistor cells formed thereon, said cells being subject to unavoidable minor variations in characteristics, each field effect transistor cell having source, drain and gate regions, the electrical resistance between the source and drain regions varying with the voltage applied to the gate region, minimum source-drain resistance occurring in respnse to a gate voltage at least as great as a saturation value;
a first conductor connecting the source regions of at least a first group of said cells to a first output terminal;
a second conductor connecting the drain regions of the first group of said cells to a second output terminal;
a third conductor connecting the drain regions of a second group of said cells to a third output terminal, the source regions of the second group of said cells being connected to said second output terminal;
a plurality of control terminals;
control conductor means individually connecting each control terminal to the gate regions of a distinct set of cells in said first group of cells so that the gate region of each cell in the first group of cells is connected to only one control terminal and each control terminal is connected to the gate regions of a predetermined plurality of cells, whereby variations of the characteristics of individual cells are averaged out to result in electrical resistance between the first and second output terminals which is inversely proportional to the number of cells in the sets of cells whose gate regions are supplied with voltages at least as great as the saturation value; and inverter means individually connecting each control terminal to the gate regions of a distinct set of cells in said second group of cells so that the gate region of each cell in said second group of cells is connected through an inverter to only one control terminal and each control terminal is connected through an inverter to the gate region of a predetermined plurality of cells, whereby the resistor network is operable as a digitally controlled variable voltage divider.

2. The resistor network of claim 1 wherein the distinct sets of field effect transistor cells in the first and second groups of cells comprise different numbers of cells.

3. The resistor network of claim 2 wherein the number of cells in each set of cells in each of the first and second groups of cells is related to the number of cells in each of the other sets in the same group by a factor of two.

4. A digitally programmable AC resistor network having at least three output terminals comprising:
a monolithic semiconductor body having first and second groups of ideally identical field effect transistor cells formed thereon, each cell having source, drain and gate regions, each cell further providing maximum electrical resistance between its source and drain regions in response to a binary gate signal of a first state and providing minimum electrical resistance between its source and drain regions in response to a binary gate signal of a second state, the first and second groups of cells each being subdivided into separate sets of cells, each set containing a plurality of cells;
first, second and third output terminals on said semiconductor body;
a first conductor connecting the source regions of the cells in said first group to said first output terminal;
a second conductor connecting the drain regions of the cells in said first group and the source regions of the cells in said second group to said second output terminal;
a third conductor connecting the drain regions of the cells in said second group to said third output terminal;
control terminal means on said semiconductor body; and
gate signal means connecting said control terminal means to the gate regions of the cells for selectively supplying binary control signals to the gate regions of corresponding sets of cells in said first and second groups, said gate signal means operating so that when a binary gate signal of one of the first and second states is supplied to the gate regions of a selected set of cells in said first group, a binary gate signal of the other of the first and second states is concurrently supplied to the gate regions of the corresponding set of cells in said second group.

5. The resistor network of claim 4 wherein said gate signal means comprises:
conductors individually connecting control terminals in said control terminal means to distinct sets of cells in said first group so that the gate region of each cell is connected to only one control terminal and each control terminal is connected to the gate regions of only a predetermined set of cells; and
inverter means including an inverter connecting each control terminal to only the gate regions of the set of cells in the second group corresponding to the set of cells in the first group connected to the same control terminal.

6. The resistor network of claim 5 wherein the distinct sets of field effect transistor cells in each group comprise different numbers of cells, and corresponding sets of cells in said first and second groups contain the same number of cells.

7. The resistor network of claim 6 wherein the number of cells in each set in a group is related to the number of cells in each of the other sets in the same group by a factor of two.

* * * * *